United States Patent
Groiss

(10) Patent No.: US 7,808,411 B2
(45) Date of Patent: Oct. 5, 2010

(54) METHOD AND CIRCUIT FOR DIGITIZING WITH IMPROVED RESOLUTION

(75) Inventor: Stefan Hermann Groiss, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 22 days.

(21) Appl. No.: 12/242,015

(22) Filed: Sep. 30, 2008

(65) Prior Publication Data

US 2010/0079326 A1    Apr. 1, 2010

(51) Int. Cl.
*H03M 1/88* (2006.01)
*H03M 1/84* (2006.01)

(52) U.S. Cl. ...................... 341/138; 341/155

(58) Field of Classification Search ................. 341/138, 341/155, 139
See application file for complete search history.

(56) References Cited

U.S. PATENT DOCUMENTS

| | | | | |
|---|---|---|---|---|
| 4,691,381 A | * | 9/1987 | Bollard | 455/334 |
| 7,158,061 B1 | * | 1/2007 | Feng et al. | 341/138 |
| 2005/0176392 A1 | * | 8/2005 | Ruitenburg et al. | 455/226.2 |

* cited by examiner

*Primary Examiner*—Peguy JeanPierre
(74) *Attorney, Agent, or Firm*—Slater & Matsil, L.L.P.

(57) ABSTRACT

Embodiments of the invention relate to a method and a corresponding circuit for digitizing an analog signal. Applying a nonlinear function to the signal, digitizing the signal and applying the inverse of the nonlinear function to the digital samples improve the digital samples.

22 Claims, 4 Drawing Sheets

METHOD AND CIRCUIT FOR DIGITIZING WITH IMPROVED RESOLUTION

TECHNICAL FIELD

The invention relates to the field of electrical signal processing and corresponding apparatuses. In particular, the invention relates to digitizing an analog signal and a corresponding electrical circuit with improved resolution.

BACKGROUND

Digital processing of electrical analog signals requires digitization of these analog signals, such that the analog signal is represented by a sequence of digital values. For that purpose the analog signal is sampled, for example, in a sample-and-hold circuit thus producing a sequence of discrete analog values. Subsequently the discrete analog values are quantized by an analog-to-digital converter, that is each analog value is mapped to one of a plurality of contiguous intervals, which is assigned to a digital number. In this way a value of the continuous analog signal is mapped to a discrete digital number. The digital value accordingly comprises an error except if the actual analog value exactly matches the middle of the interval to which it is mapped. This error is also known as quantization noise introduced by the step of quantization.

For digitizing an analog signal an analog-to-digital converter (ADC) can be used, wherein conventional ADCs may comprise a sample-and-hold sub-circuit. Linear ADCs, for example, linearly map an incoming signal to the range of output values. Typically the relative error of the output values is big for small amplitudes of the input signals and small for higher input amplitudes since small and big signal values are mapped to equally sized intervals. In contrast to that, conventional analog-to-digital converters comprising a non-linear quantization place more levels in ranges of small amplitudes, or more generally speaking in amplitude ranges of higher interest, and fewer levels where signal amplitudes are higher or less likely. However. these non-linear analog-to-digital circuits are comparatively complicated and thus expensive.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The present invention will now be described with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In particular, the functional blocks as described hereinafter for processing a signal may be implemented in various conventional designs.

Figure 1:
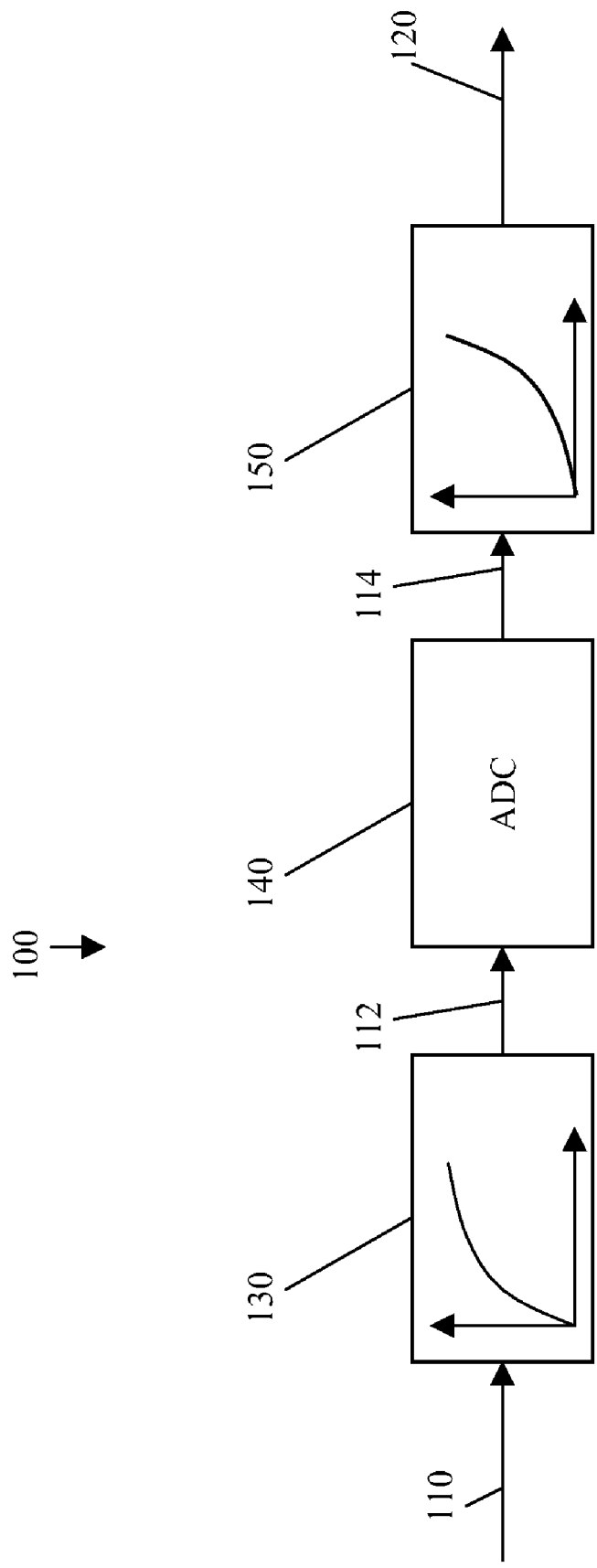
FIG. 1 depicts a block diagram according to the invention.

FIG. 1 depicts a block diagram of a circuit 100 for digitizing an analog input signal 110, which after being processed in circuit 100 is output as digital signal 120. Input signal 110 may be any analog signal produced by any arbitrary source, for example, a sensor optionally followed by an amplifier or an optional filter for reducing any noise in the signal as produced by the sensor.

In the processing block 130 a mathematical function is applied to input signal 110, which maps the signal, i.e., the amplitude of the signal, nonlinearly to a smaller range of values. That is the range of amplitude values of the input signal is mapped to a smaller range of values, wherein the applied mathematical function is non-linear. The mathematical function may be any arbitrary function suitable for mapping the amplitude range of input signal 110 to a smaller amplitude range, where an inverse function must exist for the function, i.e., the function must be bijective. By applying the bijective, nonlinear function input signal 110 is losslessly compressed. This mathematical function is referred to as a compressing function hereinafter. In one example the compressing function may be a root function, or in other words a radix function, with a radix exponent n of $n>1$. In another embodiment the function may be a logarithm function with base b being $b>1$. Due to the nonlinearity of the compressing function higher signal amplitude values are compressed more than smaller amplitude values. Depending on the properties of the function and the range of signal values processed therewith, small amplitude values may be even expanded. For example, when using a radix function with a radix exponent of $n>1$ and a signal value of $0<x<1$, the output value is greater than the original amplitude value as input. An analog compression block adapted and configured for applying the non-linear compressing function to analog signal 110 to produce the compressed analog signal 112 may implement first processing block 130.

In other embodiments an area hyperbolic sine function, i.e., arsin h( ), can be used as a compression function with a hyperbolic sine function, i.e., sin h( ), as a decompression function, or an area hyperbolic cosine function, i.e., arcosh( ), as a compression and hyperbolic cosine function, i.e., cosh( ), as a corresponding decompression function, or in still another embodiment a hyperbolic tangent function, i.e., tanh( ), can be used for compression and its corresponding inverse function, i.e., area hyperbolic tangent artanh( ), can be used for decompression. These compression functions and also its inverse decompression functions can be implemented using analog circuitry.

The output signal of block 130, i.e., signal 112, accordingly is an analog signal, i.e., continuous in time, which has a smaller amplitude range than input signal 110. Signal 112 is then coupled to the input terminal of block 140, which is a linear analog-to-digital converter (ADC). ADC 140 may be any conventional type of a linear analog-to-digital converter outputting numbers in digital form representing the amplitude value of the ADC's input value. Accordingly ADC 140 at its output provides a digital signal 114 representing the amplitude of its input signal 112 at a point in time when sampling signal 112. Digital signal 114 may be output in any conventional form, i.e., for example, via a serial or alternatively via a parallel interface.

The output of ADC 140, i.e., digital signal 114, is coupled to the input of block 150, which applies the inverse function of the compressing function to the digital values as output by ADC 140. Block 150 outputs digital signal 120, which may be output in any conventional format using any conventional interface. Functional block 150 accordingly digitally operates on digital signal 114 and outputs digital signal 120. This block may be implemented as a conventional digital signal processor (DSP) capable of performing the inverse of the compressing function to the values of signal 114 and outputting decompressed values. In one example the required functionality of block 150 can be implemented using a general purpose DSP or an application specific integrated circuit (ASIC) providing the functionality.

The function applied by block 150 to the digital input values is the inverse function of the compressing function as applied in block 130, such that the amplitude range of signal 114 is mapped nonlinearly to a greater range of values. The signal in this way is decompressed by applying the inverse of the compressing function. Accordingly, since the compressing function applied in block 130 is reversed by the function of block 150, the output signal 120 is a digital representation of analog input signal 110 without distortion by any function applied in compression block 130 or DSP block 150. Accordingly the mathematical decompressing function applied to the values of signal 114 depends on the first function applied to input signal 110. Considering the example of a radix function applied to input signal 110, then the function applied in block 150 is a potential function wherein the exponent n is that used in block 130, with n>1. In a more specific example the compressing function applied to analog input signal 110 may be a square root function, and the function applied to the values of signal 114, i.e., the decompressing function, is the square function, such that each value of output signal 120 is the square of its corresponding value of signal 114.

Similarly, if the compressing function is a logarithm, then the function applied to the values of signal 114 is an exponential function. In a more specific example using a logarithm, the compressing function, i.e., applied in block 130, is the natural logarithm and the corresponding inverse function applied in block 150 is the exponential function with base being Euler's number e.

In one embodiment output signal 114 of ADC 140 may have a resolution of p bits, with p being a positive integer. Signal 114 is then processed in DSP 150 as described above to produce an output signal 120 having the same resolution of p bits. In another embodiment DSP 150 may process the signal values as described and may furthermore map the calculated output values to values having a resolution of q bits, with q being a positive integer and q>p. In one embodiment digital signal 114 may be a 10-bit signal, i.e., with p=10 the digital sampling values having a resolution of 10 bits, and output signal 120 may be a 16-bit signal, such that DSP 150 not only applies the inverse function of the compressing function to the digital sample values of signal 114 but also converts the calculated values to q-bit values, thus implementing a finer granularity.

The effect of applying the described steps of applying the compressing function to an input signal 110, then digitizing the signal and subsequently applying the inverse function of the compressing function to the digitized samples is illustrated in FIGS. 2a-2d.

Figure 2:
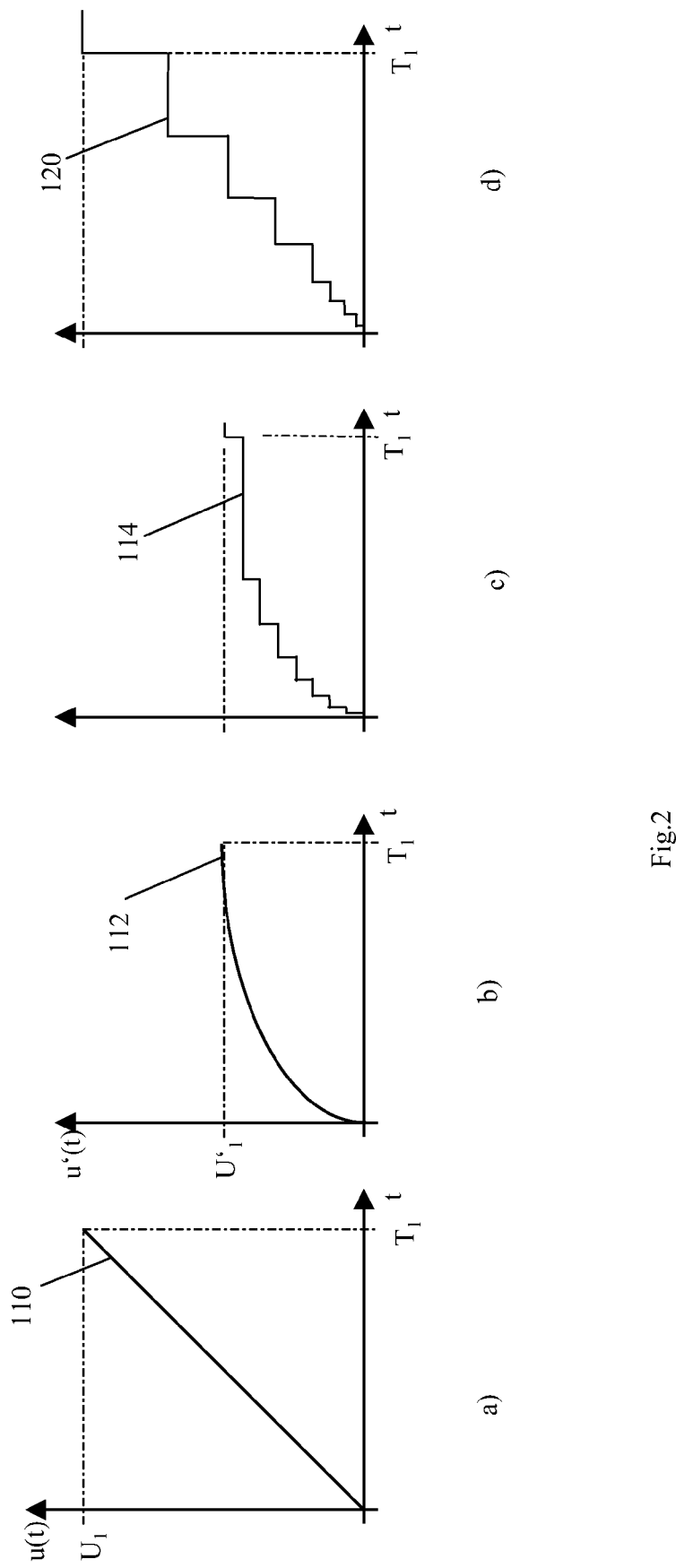
FIG. 2 depicts the signal in subsequent processing steps.

FIG. 2a) depicts an exemplary signal 110. Starting from a signal level of zero at time t=0, signal 110 increases monotonically and proportionally to time until it has reached a level of $u(t=T_1)=U_1$ at time $t=T_1$. FIG. 2b) depicts the signal after having applied the compressing function to the signal, i.e., signal 112, wherein the compressing function in this case may be chosen as $u'(t)=\sqrt{u(t)}$. According to the properties of the compressing function the amplitude of signal 112 is significantly reduced, i.e., signal 112 can be considered as a compressed version of signal 110. A conventional linear analog-to-digital converter then linearly digitizes signal 112, thus producing digital samples as illustrated in FIG. 2c). FIG. 2c) illustrates the equidistant quantizing steps, which result in the stairs having constant height. Subsequently the inverse of the compressing function is applied to the digital samples of signal 114 thus producing digital samples of output signal 120 as shown in FIG. 2d). Applying the inverse of the compressing function reverses the compression step applied to signal 110 in block 130 of FIG. 1. Since the compression function is a square root function, the inverse function is a square, such that the amplitude values of digital samples 114 are squared. Applying the inverse function to the samples of signal 114 can be considered as applying the function to the quantizing steps. As illustrated in FIG. 2d) and according to the quadratic growth property of the square function quantizing steps covering higher sample values are stretched more than quantizing steps covering smaller sample values. That is, the height of the quantizing steps is no longer equidistant, but increases quadratically according to the inverse function resulting in a finer granularity of quantizing steps for small amplitude values and coarser granularity for higher amplitude values.

The non-equidistant quantizing steps affect an improved resolution of the digital output signal 120 as quantizing steps for smaller amplitude values are smaller than quantizing steps catching higher signal amplitudes. This also affects the quantizing error in that the error of a sample value, which is based on the size of the underlying quantizing step, is reduced due to the grading of the quantization steps.

The processing chain as depicted in FIG. 1 and the corresponding method converts an analog input signal to a digital signal, wherein the digital signal provides a reduced quantization error, while at the same time using a conventional analog-to-digital converter block. In particular, the quantizing error of the generated digital signal is reduced for small signal amplitudes.

Figure 3:
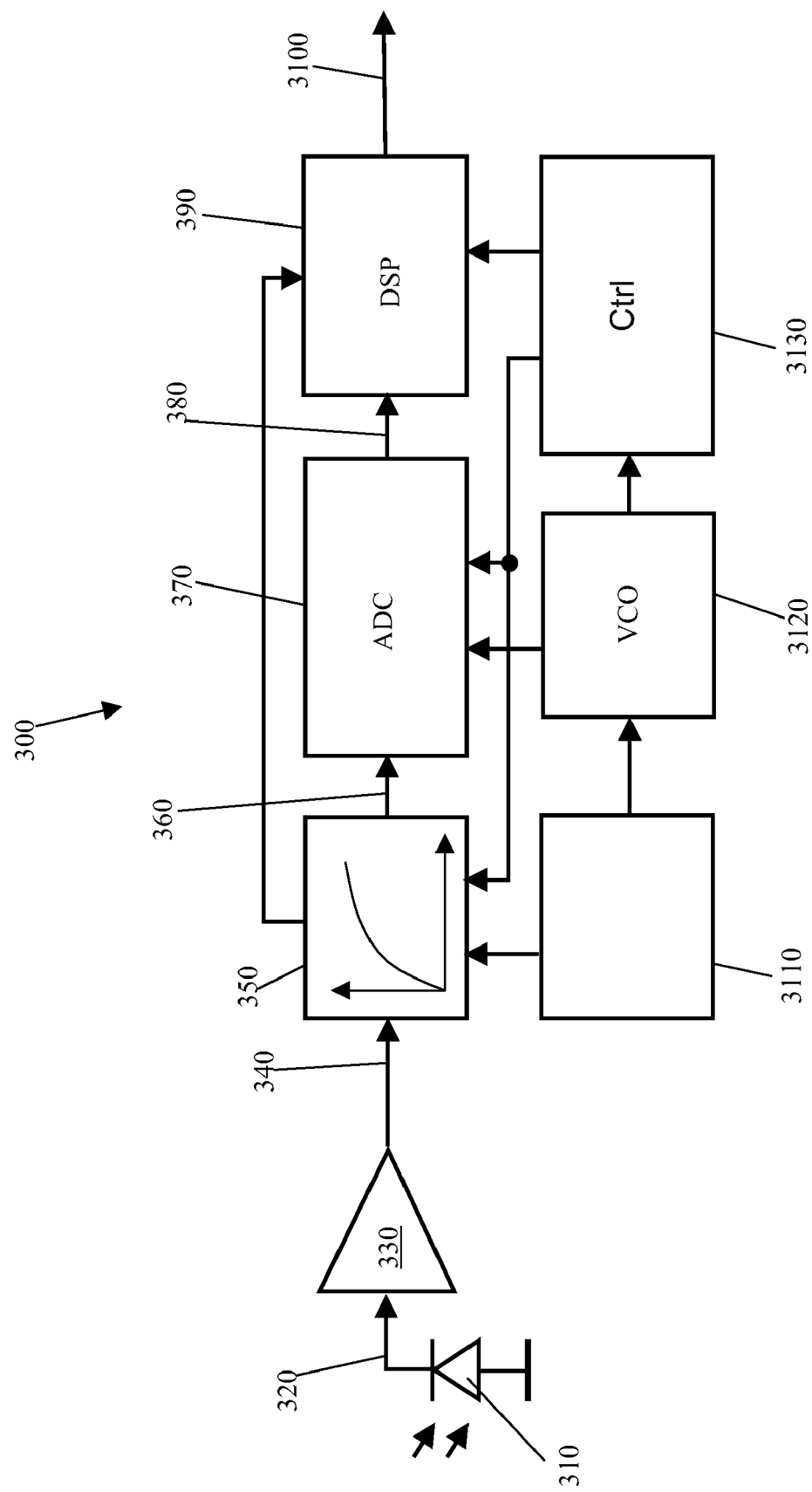
FIG. 3 depicts a block diagram of a circuit for digitizing a sensor signal.

FIG. 3 depicts a schematic circuit 300 comprising the afore-described processing chain.

An illuminated photo diode 310 outputs a signal 320, which is fed into a pre-processing stage 330 to prepare the signal as output from the photo diode for further processing. Processing stage 330, for example, may be an amplifier stage adjusting the signal level of signal 320 to a desired signal level and/or an anti-aliasing filter to restrict the bandwidth of the signal to satisfy the sampling theorem of a subsequent analog-to-digital converter. Note that instead of the photo diode, any other source outputting an analog signal may be used. Also pre-processing stage 330 may have any functionality for preparing an analog signal for feeding the signal into the subsequent processing chain.

Signal 340, i.e., the preprocessed analog signal, is then coupled as input to analog compression stage 350, which applies a compression function to its input signal. Compression stage 350 corresponds to first processing block 130 of FIG. 1. As the compression function is one of the above described compression functions compression stage 350 outputs a compressed analog signal 360. Any suitable analog circuit providing the required functionality can implement compression stage 350. An advantageous circuit for applying a logarithmic function to an input signal, for example, is illustrated later on in FIG. 4.

Analog-to-digital converter 370, which corresponds to ADC 140 of FIG. 1, linearly samples its input signal 360 and outputs the sampled signal amplitudes as digital samples 380. Accordingly signal 380 is a digital signal representing the compressed analog signal 360. Generally ADC 370 may be implemented as any conventional linear analog-to-digital converter. In an advantageous embodiment ADC 370 can be implemented as a coarse/fine-range architecture ADC thus taking advantage of these specific converters.

Digital signal processor 390 applies the inverse of the compression function to the sample values of digital signal 380 and outputs the computed values as signal 3100. Digital signal 3100 accordingly is a digital representation of signal 340, wherein this signal shows the characteristics as described above. DSP 390 in one example can be implemented by a general-purpose processor and corresponding peripheral elements or by an application specific integrated circuit (ASIC).

Circuit 300 furthermore comprises a reference source 3110 providing a reference signal, i.e., a reference current or a reference voltage, to compression stage 350 and to an oscillator 3120. In one embodiment oscillator 3120 may be a voltage-controlled oscillator (VCO) providing a clock signal to the analog-to-digital converter 370 and to a digital control sub-circuit 3130. Digital control sub-circuit 3130 in this embodiment is coupled to compression stage 350, ADC 370 and to DSP 390 to manage and timely coordinate the processing of signal 340. In particular, when signal 340 shall be sampled at predefined times only, the control sub-circuit 3130 may activate the elements in the processing chain when required and may also deactivate elements when their function is not required in order to save energy.

Figure 4:
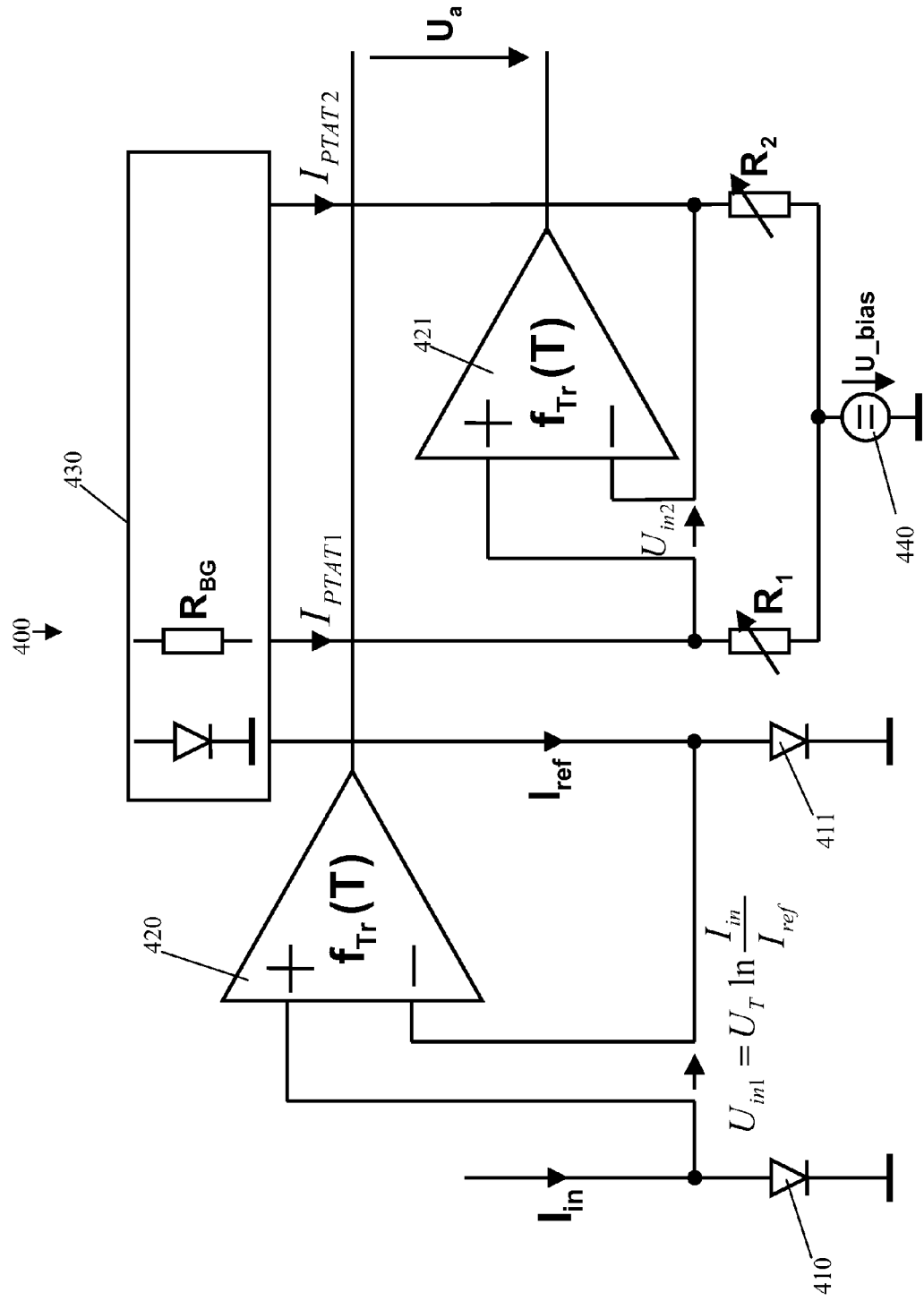
FIG. 4 depicts an embodiment of a suitable logarithm calculator.

FIG. 4 depicts a circuit 400 for applying a logarithmic function to an input signal. Circuit 400 can be used as compression stage 350.

With reference to FIG. 3 input signal $I_{in}$ in this embodiment is a current generated by a photo diode, which serves as sensor in the depicted embodiment. Note that also analog voltage signals can be used if coupled to circuit 400 via a voltage-to-current converter.

Input current $I_{in}$ is fed through bipolar diode 410 such that translinear amplifier 420, which with its other input terminal is coupled to a voltage produced by feeding reference current $I_{ref}$ through bipolar diode 411, is coupled to an input voltage of $$U_{in1} = U_T \cdot \ln\frac{I_{in}}{I_{ref}},$$

wherein $U_T$ is the temperature voltage. Reference current $I_{ref}$ is produced by reference source 430, which in one embodiment can be a controllable bandgap reference source, wherein the bandgap source has a resistance of $R_{BG}$.

Reference source 430 furthermore provides controllable current $I_{PTAT1}$ which is fed through ohmic resistor $R_1$, and constant current $I_{PTAT2}$ which is fed through resistor $R_2$. Both currents, i.e., $I_{PTAT1}$ and $I_{PTAT2}$, are proportional to absolute temperature, i.e., they are controlled in order to be proportional to absolute temperature. The voltages across controllable resistors $R_1$ and $R_2$ respectively, which may be adjusted to a predefined bias level by voltage source 440, are coupled to the input terminals of second translinear amplifier 421. That is the input voltage $U_{in2}$ of amplifier 421 is produced by the voltage difference across resistors $R_1$ and $R_2$, such that amplifier 421 accordingly produces an output voltage reflecting the difference between the voltages across resistors.

Translinear amplifiers 420, 421 are assumed to have the same amplification factor $f_{Tr}(T)$, which depends on temperature T. Output voltage $U_a$ of circuit 400 can be determined to:

$$U_a = f_{Tr}(T) \cdot U_T \cdot \ln\frac{I_{in}}{I_{ref}} - f_{Tr}(T) \cdot \frac{U_T}{R_{BG}} \cdot R_1 - f_{Tr}(T)\frac{U_T}{R_{BG}}R_2, \text{ wherein}$$

$f_{Tr}(T)$ is the amplification factor of a translinear amplifier 420, 421, and
$U_T$ is the temperature voltage.

The output voltage $U_a$ can be controlled to be zero by controlling resistors $R_1$ and $R_2$ correspondingly, wherein the resistors in one example can be controlled digitally. Accordingly, i.e., if $U_a$ is controlled to be zero, the influence of the temperature voltage and the amplification factor $f_{Tr}(T)$ of the translinear amplifiers 420, 421 disappear, such that we find:

$$0 = \ln\frac{I_{in}}{I_{ref}} - \frac{1}{R_{BG}} \cdot R_1 - \frac{1}{R_{BG}}R_2$$

Taking into account that all values of the above resistors are known, this equation determines a logarithmic correlation between input current $I_{in}$ and the values of the resistors, which are controllable.

From the values of resistors $R_1$ and $R_2$ a logarithmic transfer function of the circuit can be deduced. Considering now that the control of the resistors is digital, then we can determine an analog-to-digital transfer function of:

$$d = m \cdot \log\frac{I_{in}}{I_{ref}}, \text{ wherein}$$

d may represent a binary digital value, and m is a constant amplification factor independent of any value of resistors $R_1$, $R_2$, log is the logarithm with base 10, which is coupled to the natural logarithm ln by a constant factor.

Circuit 400 accordingly provides the function of a logarithm calculator, which in particular is suitable for supporting an analog-to-digital converter.

The functional blocks described herein can be implemented as circuits in CMOS technology. Accordingly the processing chain described herein can be implemented in one integrated circuit (IC), or the processing chain may form part of another IC, which in particular can be produced in CMOS technology.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiments disclosed.

What is claimed is:

1. A method for converting an analog input signal to a digital signal, the method comprising:
    applying a nonlinear compressing function to the analog input signal to produce a compressed analog signal;
    linearly digitizing the compressed analog signal to produce digital samples, wherein linearly digitizing the compressed analog signal produces p-bit digital samples; and
    applying an inverse function of the nonlinear compressing function to the digital samples to produce digital output samples, wherein applying the inverse function to the digital samples produces q-bit digital output samples, wherein q>p.

2. The method of claim 1, wherein the nonlinear compressing function comprises a logarithmic function with base b>1.

3. The method of claim 1, wherein the nonlinear compressing function comprises a radix function with radix exponent n>1.

4. The method of claim 1, wherein the nonlinear compressing function comprises one of an area hyperbolic sine function or an area hyperbolic cosine function or a hyperbolic tangent function.

5. The method of claim 1, further comprising amplifying the analog input signal before applying the nonlinear compressing function.

6. The method of claim 1, further comprising anti-aliasing filtering the analog input signal before applying the nonlinear function.

7. The method of claim 1, wherein p and q are integers.

8. An integrated circuit comprising:
an analog compression block for applying a nonlinear compressing function to an analog input signal to produce a compressed analog signal;
an analog-to-digital converter for digitizing the compressed analog signal to produce digital samples, wherein the analog-to-digital converter generates p-bit digital samples; and
a digital signal processor adapted and configured for applying an inverse function of the nonlinear compressing function to the digital samples to produce digital output samples, wherein the digital signal processor produces q-bit digital output samples, and wherein q>p.

9. The integrated circuit of claim 8, wherein the analog compression block is configured and adapted to apply a logarithmic function with base b>1 to the analog input signal.

10. The integrated circuit of claim 8, wherein the analog compression block is configured and adapted to apply a radix function with radix exponent n>1.

11. The integrated circuit of claim 8, wherein the analog compression block is configured and adapted to apply one of an area hyperbolic sine function or an area hyperbolic cosine function or a hyperbolic tangent function as the nonlinear compressing function.

12. The integrated circuit of claim 8, further comprising an amplifier for amplifying the analog input signal.

13. The integrated circuit of claim 8, further comprising an anti-aliasing filter for filtering the analog input signal.

14. The integrated circuit of claim 8, wherein p and q are integers.

15. An integrated circuit comprising:
means for applying a nonlinear compressing function to an analog input signal to produce a compressed analog signal; and
means for digitizing the compressed analog signal to produce p-bit digital samples; and
means for applying an inverse function of the nonlinear compressing function to the digital samples to produce q-bit digital output samples, wherein q>p.

16. The integrated circuit of claim 15, wherein the means for applying a nonlinear compressing function comprises means for applying a logarithmic function with base b>1 to the analog signal.

17. The integrated circuit of claim 15, wherein the means for applying a nonlinear compressing function comprises means for applying a radix function with radix exponent n>1.

18. The integrated circuit of claim 15, wherein the means for applying a nonlinear compressing function comprises means for applying one of an area hyperbolic sine function or an area hyperbolic cosine function or a hyperbolic tangent function as nonlinear compression function.

19. The integrated circuit of claim 15, further comprising means for amplifying the analog input signal.

20. The integrated circuit of claim 15, further comprising means for filtering the analog input signal.

21. The integrated circuit of claim 15, wherein p and q are integers.

22. A system comprising:
a compression circuit to compress an analog signal to produce a compressed signal in accordance with a nonlinear compressing function;
a digitizing circuit to digitize the compressed signal to produce p-bit digital samples; and
a digital signal processing circuit to apply an inverse function of the nonlinear compressing function to the digital samples to produce q-bit digital output samples, wherein q>p.

* * * * *